United States Patent
Watanabe et al.

(10) Patent No.: US 7,394,328 B2
(45) Date of Patent: Jul. 1, 2008

(54) OSCILLATOR CIRCUIT AND TEST APPARATUS

(75) Inventors: Daisuke Watanabe, Tokyo (JP);
Toshiyuki Okayasu, Tokyo (JP)

(73) Assignee: Advantest Corporation, Tokyo (JP)

( * ) Notice: Subject to any disclaimer, the term of this patent is extended or adjusted under 35 U.S.C. 154(b) by 5 days.

(21) Appl. No.: 11/656,346

(22) Filed: Jan. 22, 2007

(65) Prior Publication Data

US 2007/0176695 A1 Aug. 2, 2007

Related U.S. Application Data

(63) Continuation of application No. PCT/JP2005/013154, filed on Jul. 15, 2005.

(30) Foreign Application Priority Data

Jul. 20, 2004 (JP) ............... 2004-212231

(51) Int. Cl.
 H03B 5/00 (2006.01)
 H03B 5/12 (2006.01)
 H03B 5/24 (2006.01)
 H03K 3/03 (2006.01)
 H03L 7/083 (2006.01)
 H03L 7/099 (2006.01)
 H03L 7/24 (2006.01)

(52) U.S. Cl. ............... 331/172; 331/18; 331/57; 331/117 FE; 331/153; 331/177 V

(58) Field of Classification Search ........... 331/1 A, 331/8, 18, 34, 36 C, 55, 57, 117 R, 117 FE, 331/117 D, 145, 149, 154, 165, 166, 172, 331/177 R, 177 V See application file for complete search history.

(56) References Cited

U.S. PATENT DOCUMENTS

2008/0061892 A1* 3/2008 Staszewski et al. ........... 331/55

FOREIGN PATENT DOCUMENTS

JP 10-70442 3/1998
JP 2001-282383 10/2001

OTHER PUBLICATIONS

International Search Report issued in International Application No. PCT/JP2005/013154 mailed on Sep. 6, 2005 and English translation thereof, 2 pages.

* cited by examiner

*Primary Examiner*—David Mis
(74) *Attorney, Agent, or Firm*—Osha Liang LLP

(57) ABSTRACT

An oscillator circuit that generates an oscillation signal is provided. The oscillator circuit includes an oscillator that generates the oscillation signal based on positive feedback of a signal, a synchronization signal generating section that generates a compulsory synchronization signal having an edge that (i) crosses a zero cross point at an ideal timing of an edge of the oscillation signal every predetermined number of cycles of the oscillation signal and (ii) has a gradient in the same direction as the edge of the oscillation signal, and a combining section that injects the compulsory synchronization signal into a positive feedback path of the oscillator.

9 Claims, 10 Drawing Sheets

OSCILLATOR CIRCUIT AND TEST APPARATUS

CROSS REFERENCE TO RELATED APPLICATION

This is a continuation application of PCT/JP2005/013154 filed on Jul. 15, 2005 which claims priority from a Japanese Patent Application No. 2004-212231 filed on Jul. 20, 2004, the contents of which are incorporated herein by reference.

BACKGROUND

1. Technical Field

The present invention relates to an oscillator circuit that generates an oscillation signal and a test apparatus that tests an electronic device.

2. Related Art

A phase locked loop (PLL) circuit is conventionally known as a circuit for generating an oscillation signal. According to the PLL circuit, a reference signal and an oscillation signal generated by a voltage controlled oscillator are compared with each other in terms of phase, and the frequency of the oscillation signal generated by the voltage controlled oscillator is controlled based on the result of the comparison. The frequency of the oscillation signal is equal to an integral multiple of the frequency of the reference signal, and is controlled at the timing of each edge of the reference signal so that the oscillation signal is synchronized to the reference signal. The voltage controlled oscillator of the PLL circuit is typically formed by using a ring oscillator circuit, an LC resonator circuit or the like.

As mentioned above, the voltage controlled oscillator, which is configured by using a ring oscillator circuit or LC resonator circuit, generates an oscillation signal based on positive feedback or the like. This poses a problem that a phase noise attributed to the voltage controlled oscillator is gradually accumulated. To be specific, since the oscillation signal is compared to the reference signal in terms of phase, the mean value of the phase of each cycle of the oscillation signal is synchronized to that of the reference signal, but the phase jitter component of each cycle is accumulated. For example, the amplitude of the phase jitter component gradually increases with the mean value of the phase of each cycle of the oscillation signal being positioned in the middle.

In view of the above, an advantage of some embodiments of the present invention is to provide an oscillator circuit and a test apparatus that can solve the above-described problem. This advantage is achieved by combining the features recited in the independent claims. The dependent claims define further effective specific example of the present invention.

SUMMARY

To solve the above-identified problem, a first aspect of the present invention provides an oscillator circuit that generates an oscillation signal. The oscillator circuit includes an oscillator that generates the oscillation signal based on positive feedback of a signal, a synchronization signal generating section that generates a compulsory synchronization signal having an edge that (i) crosses a zero cross point at an ideal timing of an edge of the oscillation signal every predetermined number of cycles of the oscillation signal and (ii) has a gradient in the same direction as the edge of the oscillation signal, and a combining section that injects the compulsory synchronization signal into a positive feedback path of the oscillator.

The oscillator may be a voltage controlled oscillator that generates the oscillation signal having a frequency determined in accordance with a control voltage supplied thereto. The oscillator circuit may further include a reference signal generating section that generates a reference signal which has a predetermined frequency, where the reference signal controls a phase of the oscillation signal, and a phase comparator that generates the control voltage based on a difference in phase between the reference signal and the oscillation signal and supplies the generated control voltage to the voltage controlled oscillator. The synchronization signal generating section may generate the compulsory synchronization signal based on the reference signal.

The synchronization signal generating section may invert a signal generated by differentiating the reference signal and further differentiate the inverted signal, so as to generate the compulsory synchronization signal. The combining section and phase comparator may alternately control the phase of the oscillation signal by means of the compulsory synchronization signal and control the frequency of the oscillation signal by means of the control voltage.

The oscillator circuit may further include a frequency dividing circuit that generates a frequency divided reference signal by dividing the frequency of the reference signal. The synchronization signal generating section may generate the compulsory synchronization signal based on one of leading and trailing edges of the frequency divided reference signal, and the phase comparator may generate the control voltage based on a difference in phase between the other edge of the frequency divided reference signal and the oscillation signal.

The synchronization signal generating section may include a leading edge differentiating circuit that differentiates the leading edge of the frequency divided reference signal, an inverting circuit that inverts a signal output from the leading edge differentiating circuit, and a differentiating circuit that differentiates a signal output from the inverting circuit.

The oscillator may be a ring oscillator circuit in which an odd number of stages of inverters are connected to each other in series in such a manner that the oscillation signal output from an inverter of the last stage is fed back into an input terminal of an inverter of the first stage, and the combining section may capacitively couple an output terminal of the differentiating circuit and the input terminal of the inverter of the first stage so as to inject the compulsory synchronization signal.

The oscillator may be an LC resonator circuit including therein an induction component and a capacitance component, and the combining section may capacitively couple an output terminal of the differentiating circuit and the induction component so as to inject the compulsory synchronization signal.

A second aspect of the present invention provides a test apparatus that tests an electronic device. The test apparatus includes a pattern generator that generates a test pattern to test the electronic device, an oscillator circuit that generates an oscillation signal having a frequency determined in accordance with a frequency of a test signal to be input into the electronic device, a waveform shaper that generates the test signal to be input into the electronic device based on the test pattern generated by the pattern generator and the oscillation signal generated by the oscillator circuit, and a judging section that judges whether the electronic device is good or bad by comparing an output signal output from the electronic device with an expected value pattern generated by the pattern generator. The oscillator circuit includes an oscillator that generates the oscillation signal based on positive feedback of a signal, a synchronization signal generating section that generates a compulsory synchronization signal having an edge that (i) crosses a zero cross point at an ideal timing of an edge of the oscillation signal every predetermined number of cycles of the oscillation signal and (ii) has a gradient in the same direction as the edge of the oscillation signal, and a combining section that injects the compulsory synchronization signal into a positive feedback path of the oscillator.

Here, all the necessary features of the present invention are not listed in the summary. The sub-combinations of the features may become the invention.

DESCRIPTION OF EXEMPLARY EMBODIMENTS

Hereinafter, one aspect of the present invention will be described through one or more embodiments. The embodiments do not limit the invention according to the claims, and all the combinations of the features described in the embodiments are not necessarily essential to means provided by aspects of the invention.

Figure 1:
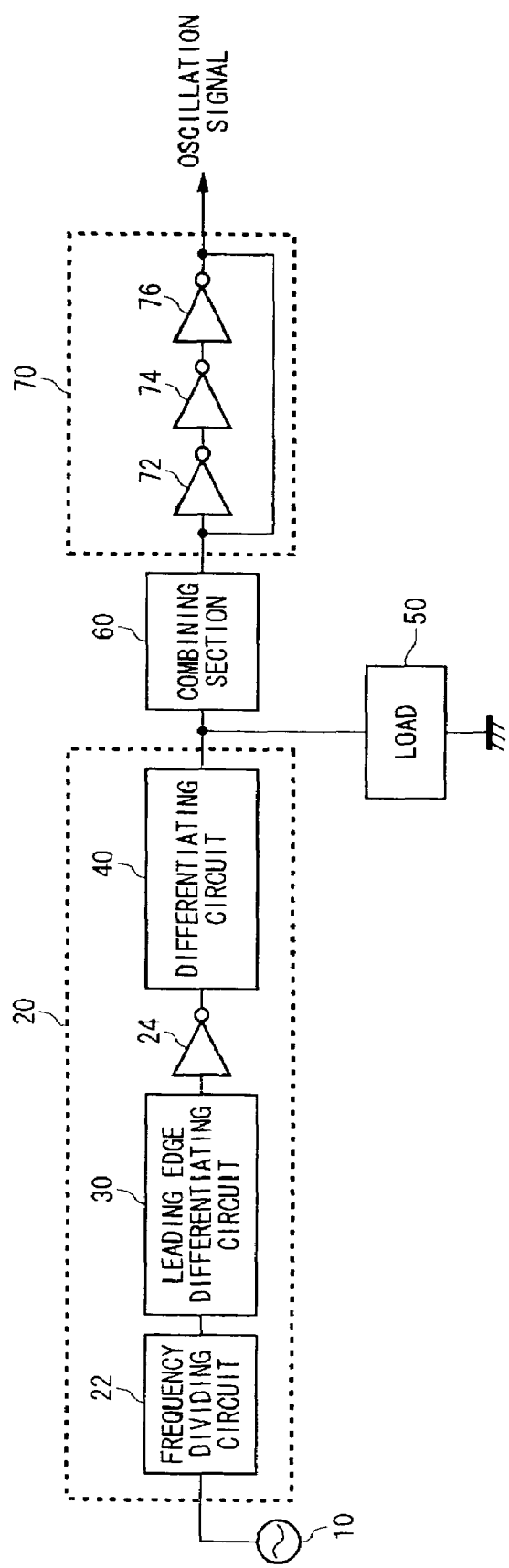
FIG. 1 shows an example of the configuration of an oscillator circuit 100 relating to an embodiment of the present invention.

FIG. 1 shows an example of the configuration of an oscillator circuit 100 relating to an embodiment of the present invention. The oscillator circuit 100 generates an oscillation signal, and includes therein a reference signal generating section 10, a synchronization signal generating section 20, a combining section 60, a load 50 and an oscillator 70.

The reference signal generating section 10 generates a reference signal that has a predetermined frequency and is used to control the phase of the oscillation signal. According to the present embodiment, the reference signal generated by the reference signal generating section 10 has a frequency equal to an integral multiple of the frequency of the oscillation signal generated by the oscillator 70. When the oscillator circuit 100 is used in a test apparatus for testing an electronic device such as a semiconductor circuit, the reference signal generating section 10 generates a common reference clock to be used in the entire test apparatus. In this case, the oscillator circuit 100 supplies a clock having a predetermined frequency to one or more constituents of the test apparatus which are required to operate at a different frequency from the frequency of the reference clock.

The oscillator 70 generates the oscillation signal based on positive feedback of a signal. The oscillator 70 is a voltage controlled oscillator that generates an oscillation signal having a frequency corresponding to a control voltage supplied thereto, for example. The oscillator 70 may be a ring oscillator circuit formed by a plurality of inverters (72, 74 and 76) that are connected to each other in a loop shape. Alternatively, the oscillator 70 may be an LC resonator circuit or a differential ring oscillator circuit.

The synchronization signal generating section 20 generates a compulsory synchronization signal having an edge that crosses the zero cross point at an ideal timing of the edge of the oscillation signal every predetermined number of cycles of the oscillation signal and that has a gradient in the same direction as the edge of the oscillation signal. With such a compulsory synchronization signal being injected into the positive feedback path of the oscillator 70, it is made possible to draw the phase of the oscillation signal generated by the oscillator 70 into the ideal timing every predetermined number of cycles. According to the present embodiment, the synchronization signal generating section generates the compulsory synchronization signal by inverting a signal generated by differentiating a frequency divided reference signal and further differentiating the inverted signal. The synchronization signal generating section 20 relating to the present embodiment includes therein a frequency dividing circuit 22, a leading edge differentiating circuit 30, an inverting circuit 24 and a differentiating circuit 40.

The frequency dividing circuit 22 generates a frequency divided reference signal by dividing the frequency of the reference signal generated by the reference signal generating section 10. In other words, the frequency divided reference signal generated by the frequency dividing circuit 22 has a cycle time determined in accordance with the above-mentioned predetermined number of cycles.

The leading edge differentiating circuit 30 differentiates the leading edge of the frequency divided reference signal. It is noted here that the leading edge of the frequency divided reference signal indicates the rising edge in each cycle of the frequency divided reference signal when the oscillator circuit 100 operates in accordance with positive logic, and indicates the falling edge in each cycle of the frequency divided reference signal when the oscillator circuit 100 operates in accordance with negative logic.

The inverting circuit 24 inverts the signal output from the leading edge differentiating circuit 30, and inputs the inverted signal into the differentiating circuit 40. The differentiating circuit 40 differentiates the signal output from the inverting circuit 24, and outputs the differentiated signal. The above-described configuration enables the synchronization signal generating section 20 to generate the above-mentioned compulsory synchronization signal.

The synchronization signal generating section 20 is grounded via the load 50. The combining section 60 combines the output terminal of the differentiating circuit 40 with the positive feedback path of the oscillator 70, so as to inject the compulsory synchronization signal into the positive feedback path of the oscillator 70. The oscillator 70 is a ring oscillator circuit formed in such a manner that an odd number of stages of inverters (72, 74 and 76) are connected in series and the oscillation signal output from the inverter 76 of the last stage is fed back into the input of the inverter 72 of the first stage, for example. The combining section 60 capacitively couples the output terminal of the differentiating circuit 40 to the input terminal of the inverter 72 of the first stage, so as to inject the compulsory synchronization signal into the positive feedback path of the oscillator 70.

Figure 2:
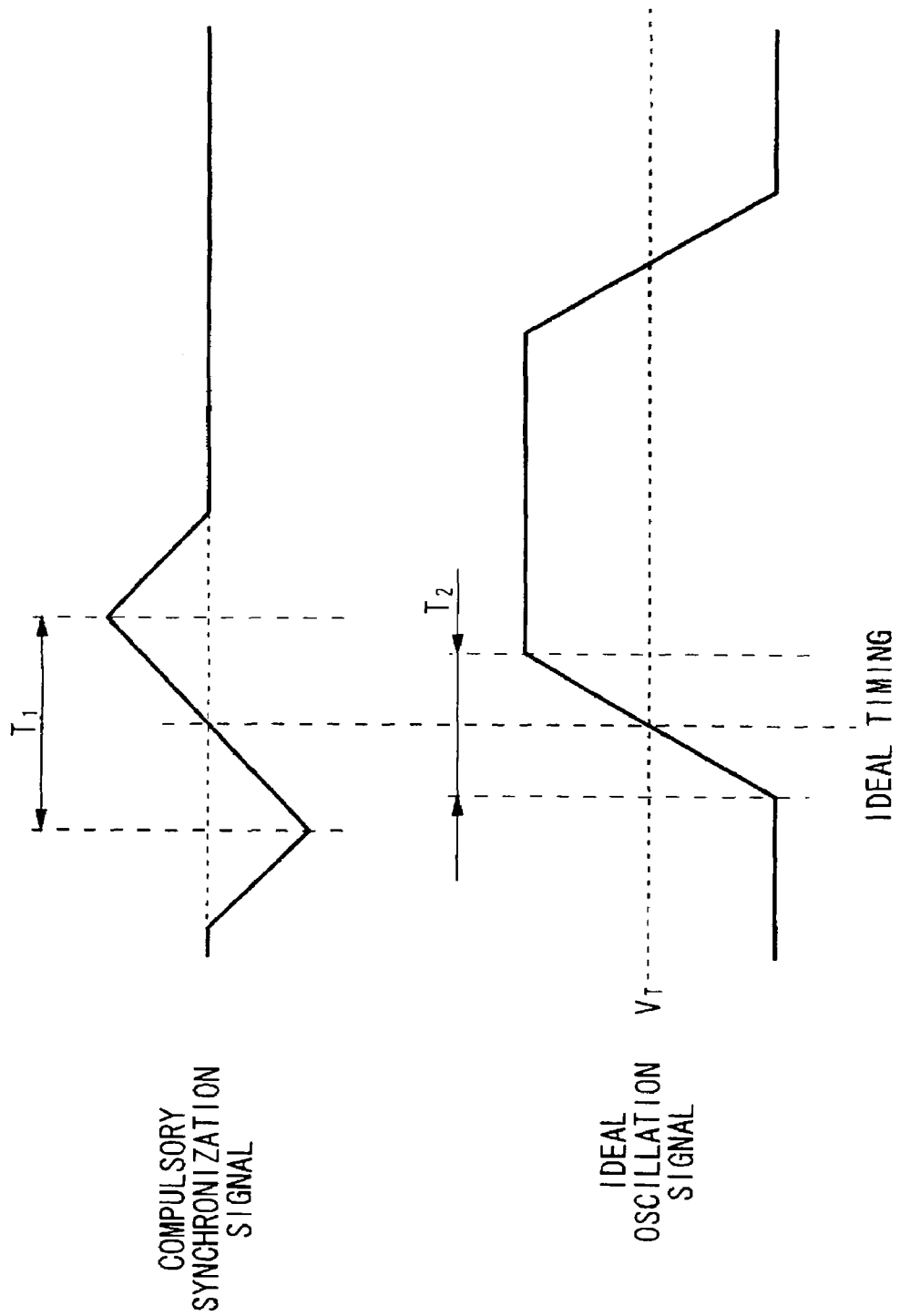
FIG. 2 is used to explain an example of a compulsory synchronization signal.

FIG. 2 is used to explain an example of the compulsory synchronization signal. As described above, the compulsory synchronization signal generated by the synchronization signal generating section 20 has an edge that crosses the zero cross point at an ideal timing of the edge of the oscillation signal every predetermined number cycles of the oscillation signal and that has a gradient in the same direction as the edge of the oscillation signal. It is noted here that the edge of the compulsory synchronization signal which has a gradient in the same direction as the edge of the oscillation signal refers to an edge having a positive gradient when the edge of the oscillation signal is a rising edge, and refers to an edge having a negative gradient when the edge of the oscillation signal is a falling edge. In the present embodiment, the edge of the compulsory synchronization signal which crosses the zero cross point at the ideal timing has a positive gradient.

As illustrated in FIG. 2, an ideal oscillation signal without a phase jitter component crosses a threshold voltage $V_T$ at the ideal timing. If the oscillation signal includes a phase jitter component, on the other hand, the oscillation signal crosses the threshold voltage $V_T$ at a timing different from the ideal timing. Since the oscillator 70 generates the oscillation signal based on positive feedback or the like, the amplitude of the phase jitter component gradually increases. To solve this problem, the above-mentioned compulsory synchronization signal is injected into the oscillation signal, according to the oscillator circuit 100 relating to the present embodiment, so that the phase jitter component of the oscillation signal is reduced every predetermined number of cycles of the oscillation signal.

For example, if the timing at which the oscillation signal crosses the threshold voltage $V_T$ is earlier than the ideal timing, the negative portion of the compulsory synchronization signal is injected into the level of the oscillation signal at the timing ($V_T$). In this way, the timing at which the oscillation signal crosses the threshold voltage $V_T$ is drawn into the ideal timing. Here, the amount of the phase shift of the oscillation signal caused by the compulsory synchronization signal increases in accordance with the difference between the timing at which the oscillation signal crosses the threshold value $V_T$ and the ideal timing.

As described above, the phase of the oscillation signal is shifted every predetermined number of cycles by an amount determined in accordance with the amplitude of the phase jitter component of the oscillation signal. In this way, the phase jitter component of the oscillation signal can be prevented from being accumulated, so that the amplitude of the phase jitter component is kept under a certain level. Another advantage is explained in the following. When the phase of the oscillation signal is adjusted to the ideal timing every predetermined number of cycles, the cycle time of the oscillation signal significantly changes before and after the cycle in which the adjustment is made, which makes it impossible to maintain the continuity of the oscillation signal. This problem is also solved by the oscillator circuit 100 relating to the present embodiment in the following manner. Since the phase jitter component of the oscillation signal is reduced every predetermined number of cycles, the continuity of the oscillation signal can be maintained.

As illustrated in FIG. 2, the value of the compulsory synchronization signal varies with a gradient in the same direction as the gradient of the edge of the oscillation signal within a compulsory synchronization valid range $T_1$. Here, it is preferable that the compulsory synchronization valid range $T_1$ is sufficiently larger than the rising time (or falling time) $T_2$ of the oscillation signal.

Figure 3:
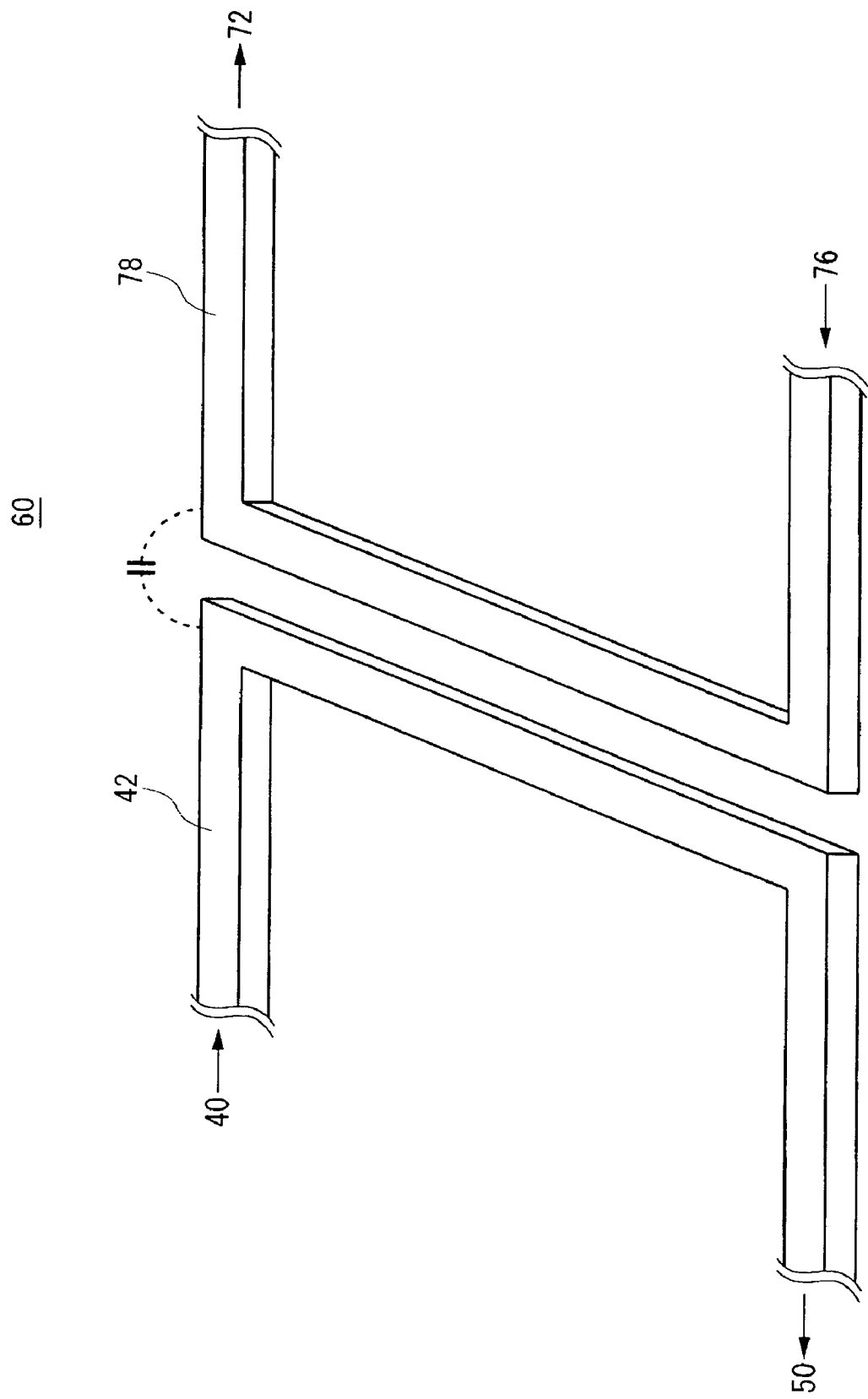
FIG. 3 shows an example of a combining section 60.

FIG. 3 shows an example of the combining section 60. According to the present embodiment, the combining section 60 includes therein wires 42 and 78. The compulsory synchronization signal output from the differentiating circuit 40 is input into the load 50 via the wire 42 as shown in FIG. 3. Furthermore, the oscillation signal output from the inverter 76 is input into the inverter 72 via the wire 78. Referring to FIG. 3, the wires 42 and 78 are provided in the vicinity of each other.

Being positioned in the vicinity of each other as mentioned above, the wires 42 and 78 can be coupled to each other by wire coupling capacitance. The wire coupling capacitance enables the compulsory synchronization signal to be injected into the oscillation signal. Such a configuration enables the combining section 60 to inject the compulsory synchronization signal into the oscillation signal without causing a significant influence on the load balance of the oscillator 70.

The combining section 60 may additionally include means for AC coupling the wires 42 and 78 directly. For example, the combining section 60 may include a capacitor between the wires 42 and 78.

Figure 4:
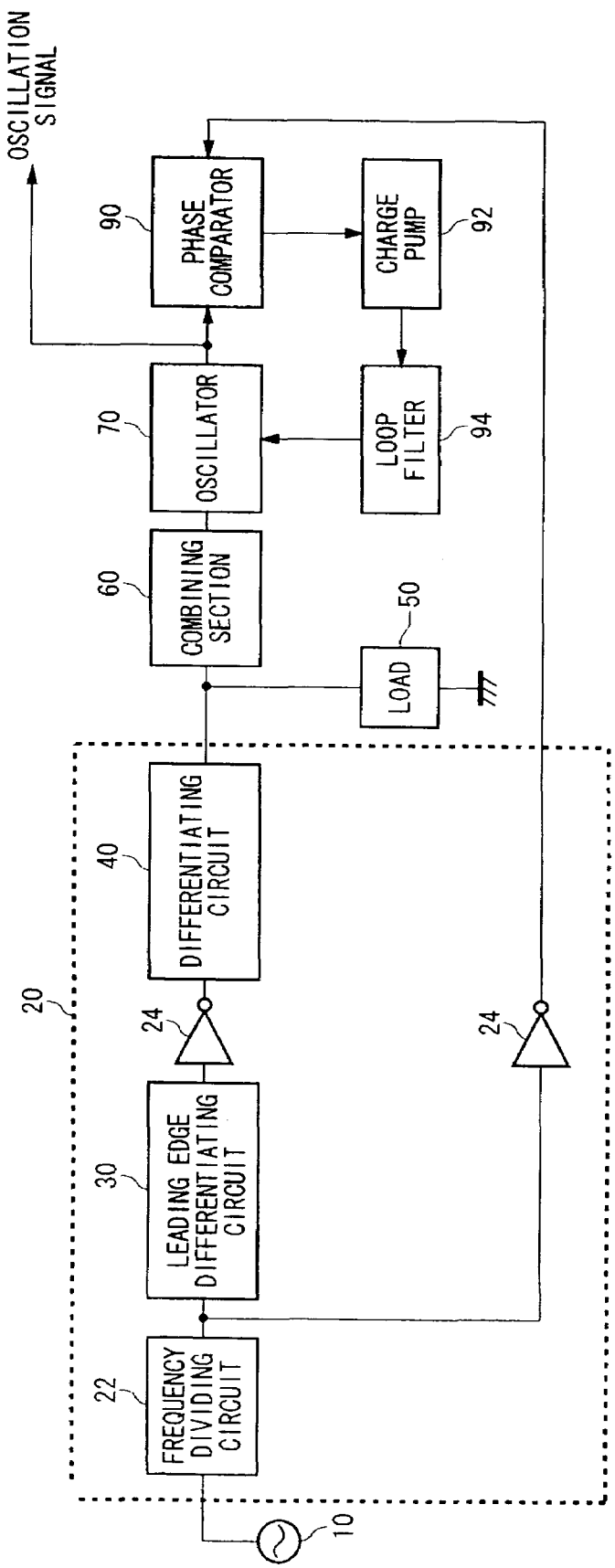
FIG. 4 shows an example of the configuration of an oscillator circuit 200 relating to another embodiment of the present invention.

FIG. 4 shows an example of the configuration of an oscillator circuit 200 relating to another embodiment of the present invention. The oscillator circuit 200 includes therein a phase comparator 90, a charge pump 92 and a loop filter 94 in addition to the constituents of the oscillator circuit 100 described with reference to FIG. 1, and the synchronization signal generating section 20 additionally includes an inverter 26. The constituents shown in FIG. 4 which are assigned the same reference numerals as in FIG. 1 have the same functions as the corresponding constituents described with reference to FIG. 1.

The phase comparator 90 generates a control voltage based on the difference in phase between the frequency divided reference signal and the oscillation signal. Furthermore, the phase comparator 90 provides the control voltage to the oscillator 70 via the charge pump 92 and loop filter 94 so as to control the frequency of the oscillation signal generated by the oscillator 70. That is to say, the oscillator 70, phase comparator 90, charge pump 92 and loop filter 94 collectively function as a PLL circuit.

The oscillator circuit 200 relating to the present embodiment can synchronize the mean value of the phase of each cycle of the oscillation signal to that of the reference signal, and can reduce the phase jitter component of the oscillation signal with it being possible to maintain the continuity of the oscillation signal. In addition, even if the amplitude of the phase jitter component of the oscillation signal becomes larger than the compulsory synchronization valid range $T_1$ illustrated with reference to FIG. 2, the amplitude of the phase jitter component can be reduced by the phase comparator 90, which synchronizes the mean value of the phase to the frequency divided synchronization signal every predetermined number of cycles.

It is preferable that the combining section 60 and phase comparator 90 alternately control the phase of the oscillation signal by means of the compulsory synchronization signal and control the frequency of the oscillation signal by means of the control voltage. According to the present embodiment, the reference signal generated by the reference signal generating section 10 has a cycle time determined in accordance with the timing of controlling the phase of the oscillation signal. As described above, the synchronization signal generating section 20 generates the compulsory synchronization signal based on the reference signal. According to the present embodiment, the frequency divided reference signal generated by the frequency dividing circuit 22 has a cycle time double the cycle time of the reference signal.

The synchronization signal generating section 20 generates the compulsory synchronization signal based on one of the leading and trailing edges of the frequency divided reference signal. The phase comparator generates the control voltage based on the difference in phase between the other edge of the frequency divided reference signal and the oscillation signal. According to the present embodiment, the inverter 26 inverts the frequency divided reference signal generated by the frequency dividing circuit 22, and inputs the inverted signal into the phase comparator 90, so as to cause the combining section 60 and phase comparator 90 alternately to control the oscillation signal.

Since the combining section 60 and phase comparator 90 alternately control the oscillation signal, the oscillator circuit 200 can accurately perform both the control to synchronize the mean value of the phase of each cycle of the oscillation signal to that of the reference signal and the control to reduce the phase jitter component of the oscillation signal. According to the present embodiment, the frequency divided reference signal generated by the frequency dividing circuit 22 has a cycle time double the cycle time of the reference signal. Therefore, the control of the phase of the oscillation signal by means of the compulsory synchronization signal and the control of the frequency of the oscillation signal by means of the control voltage are alternately performed at even intervals. In another embodiment, the frequency dividing ratio of the frequency dividing circuit 22 may be set to a desired value so that the control of the phase of the oscillation signal by means of the compulsory synchronization signal and the control of the frequency of the oscillation signal by means of the control voltage are alternately performed at desired intervals.

Figure 5:
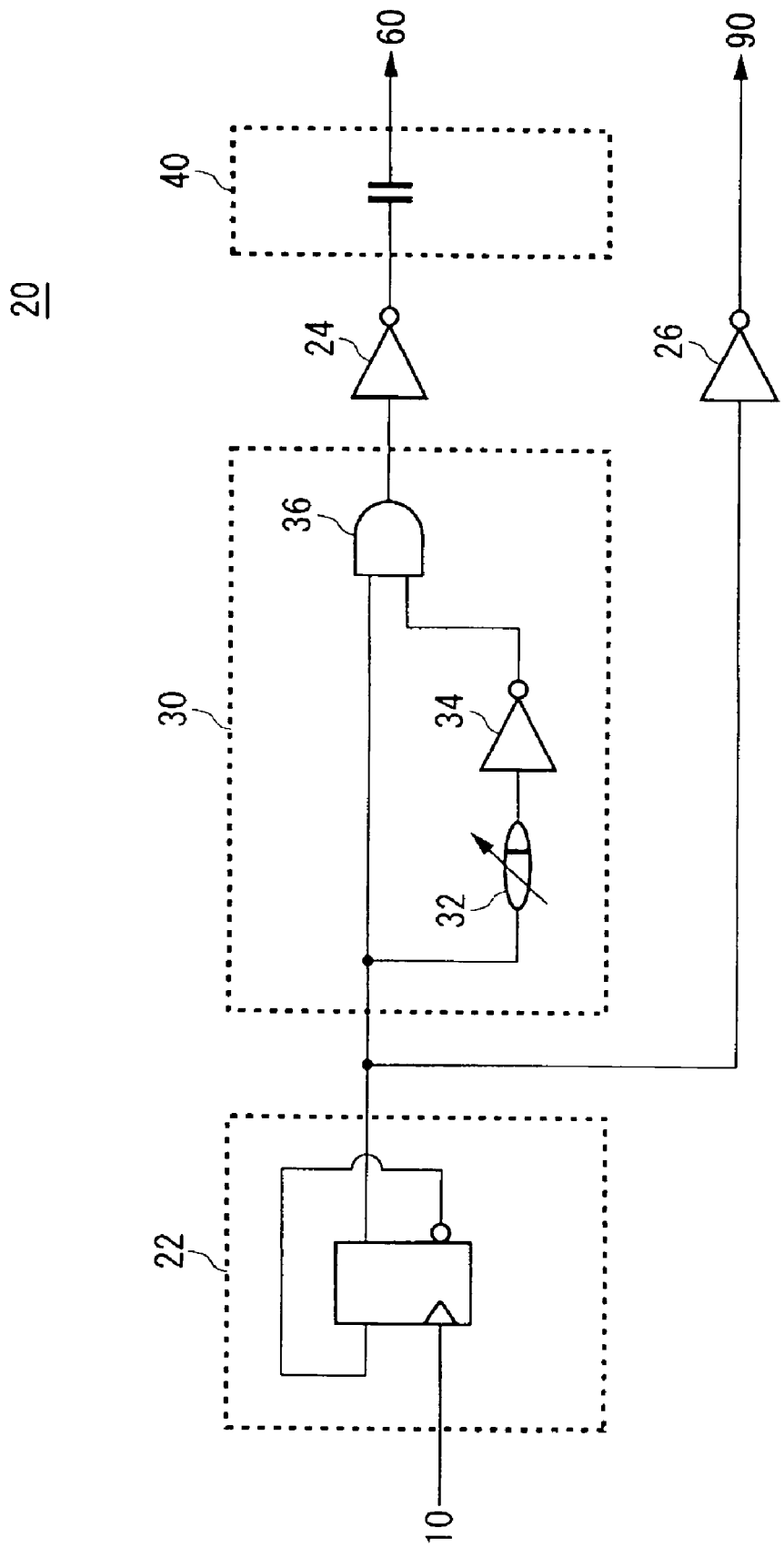
FIG. 5 shows an example of the configuration of a synchronization signal generating section 20 in detail.

FIG. 5 shows an example of the configuration of the synchronization signal generating section 20 in detail. As shown in FIG. 5, the frequency dividing circuit 22 includes therein a flip-flop into which the reference signal is input as a trigger and into which the inverted output is fed back. This configuration enables the frequency dividing circuit 22 to generate the frequency divided reference signal having a cycle time double the cycle time of the reference signal.

The leading edge differentiating circuit 30 includes therein a variable delay circuit 32, an inverter 34 and a logical AND circuit 36. The variable delay circuit 32 delays the frequency divided reference signal by a predetermined time period. The inverter 34 inverts the frequency divided reference signal that has been delayed by the variable delay circuit 32 and outputs the inverted signal. The logical AND circuit 36 outputs a logical AND between the frequency divided reference signal output from the frequency dividing circuit 22 and the frequency divided reference signal output from the inverter 34. Such a configuration enables the leading edge differentiating circuit 30 to differentiate the leading edge of the frequency divided reference signal, to generate a signal.

As shown in FIG. 5, the differentiating circuit 40 uses a capacitor to differentiate the signal input by the inverter circuit 24, to generate the compulsory synchronization signal. The above-described configuration enables the synchronization signal generating section 20 to second order differentiate the frequency divided reference signal, so as to generate the compulsory synchronization signal.

Figure 6:
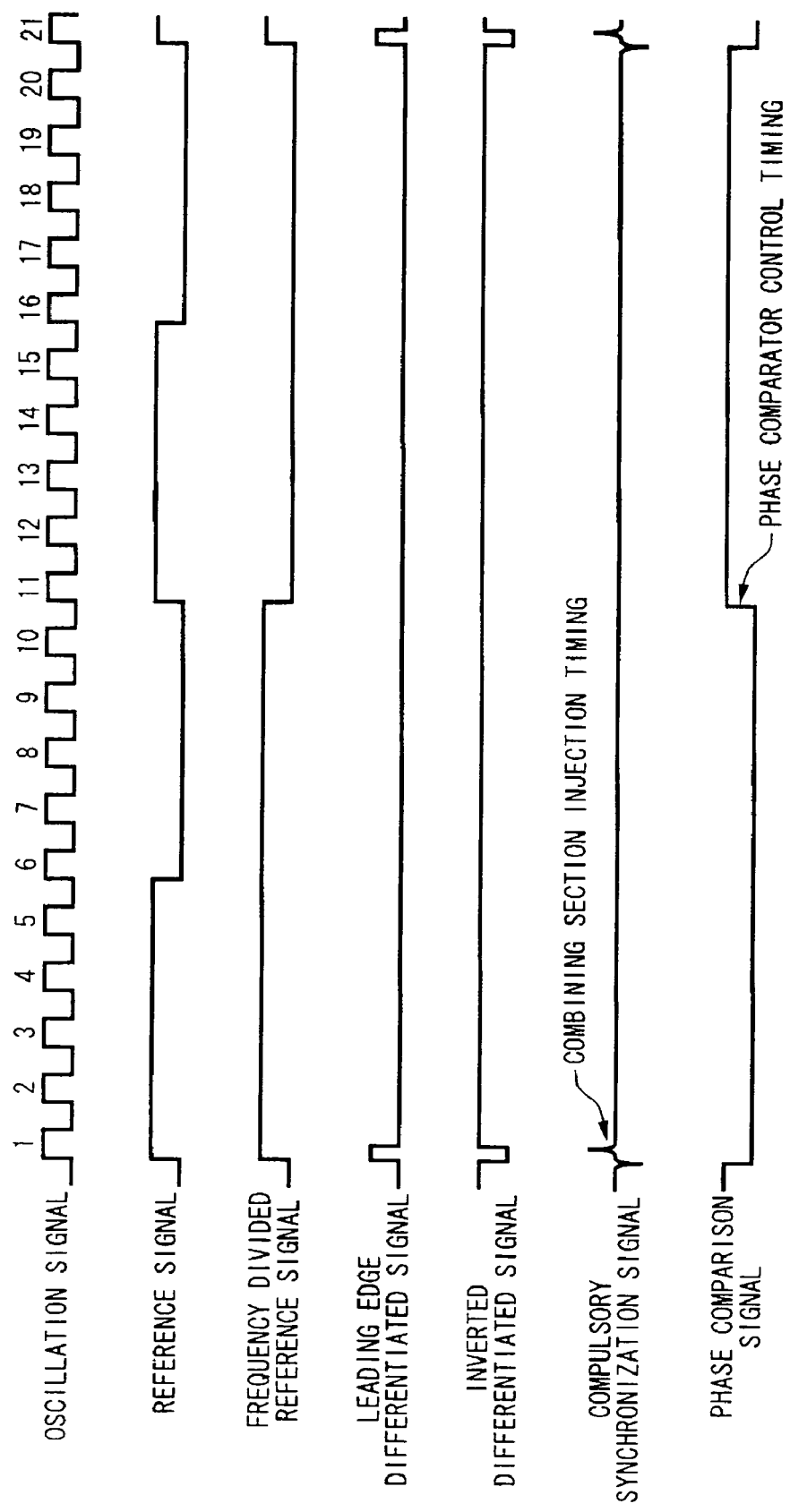
FIG. 6 is a timing chart showing an example of an operation performed by the oscillator circuit 200.

FIG. 6 is a timing chart showing an example of the operation performed by the oscillator circuit 200. As mentioned above, the reference signal generating section 10 generates the reference signal having a cycle time equal to an integral multiple of the cycle time of the oscillation signal. The frequency dividing circuit 22 divides the frequency of the reference signal, to generate the frequency divided reference signal having a cycle time double the cycle time of the reference signal.

The leading edge differentiating circuit 30 generates the leading edge differentiated signal by differentiating the leading edge of the frequency divided reference signal. The inverter circuit 24 generates the inverted differentiated signal by inverting the leading edge differentiated signal. The differentiating circuit 40 differentiates the inverted differentiated signal, to generate the compulsory synchronization signal. According to the present embodiment, the leading edge differentiated signal is inverted and then differentiated. According to another embodiment, however, the frequency divided reference signal may be second order differentiated and then inverted. According to the present embodiment, the oscillation signal is controlled by using the compulsory synchronization signal every 20 cycles of the oscillation signal. Thus, it is a phase jitter component of only 20 cycles which is accumulated in the oscillation signal.

The inverter 26 inverts the frequency divided reference signal, to generate a phase comparison signal, and inputs the phase comparison signal into the phase comparator 90. In this way, the combining section injection timing at which the combining section 60 controls the phase of the oscillation signal by using the compulsory synchronization signal and the phase comparator control timing at which the phase comparator 90 controls the frequency of the oscillation signal by using the control voltage can be alternately arranged at even intervals.

Figure 7:
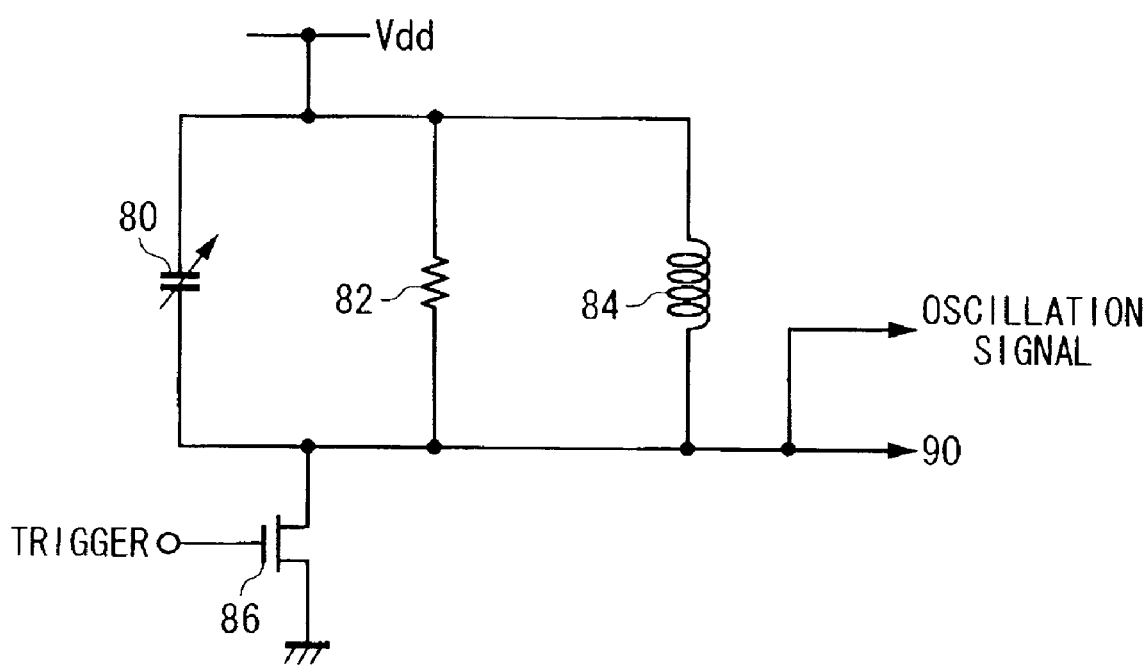
FIG. 7 shows another example of the configuration of an oscillator 70.

FIG. 7 shows another example of the configuration of the oscillator 70. The oscillator 70 relating to the present embodiment is an LC resonator circuit including therein a capacitance component 80 having a variable capacitance, a resistance 82, an induction component 84 and a transistor 86. The capacitance component 80, resistance 82 and induction component 84 are provided in parallel between the driving potential $V_{dd}$ and the ground potential, and generate the oscillation signal in accordance with the trigger signal input into the gate of the transistor 86. The capacitance of the capacitance component 80 is controlled by the control voltage supplied by the phase comparator 90, so that an oscillation signal having a frequency determined in accordance with the control voltage is generated. In the present embodiment, the capacitance component 80 and induction component 84 are a capacitor and a coil respectively.

In the present embodiment, the combining section 60 capacitively couples the output terminal of the differentiating circuit 40 and the induction component 84, so as to inject the compulsory synchronization signal into the oscillation signal. This configuration enables the compulsory synchronization signal to be injected into the oscillation signal generated by the oscillator 70 configured using an LC resonator circuit.

Figure 8:
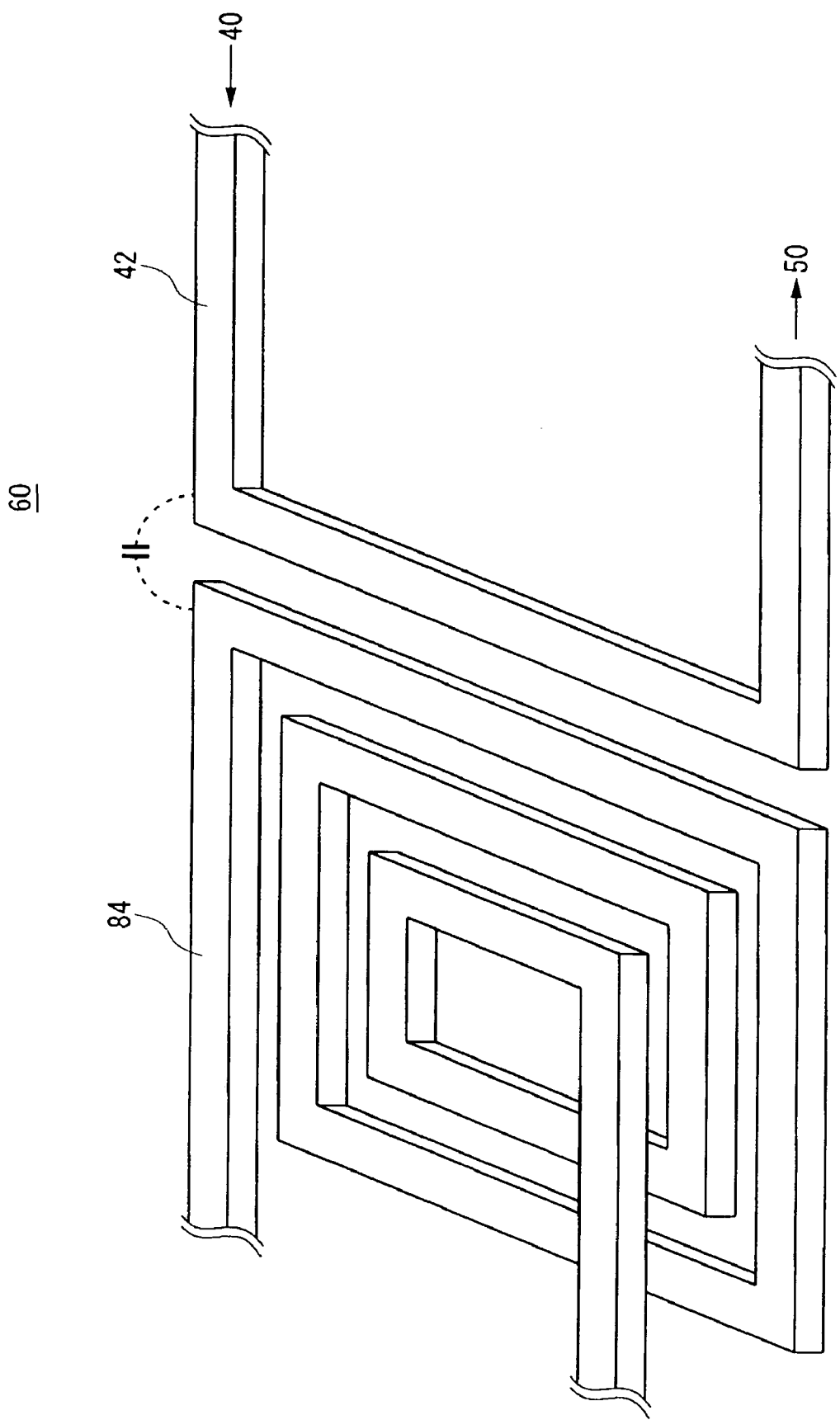
FIG. 8 is used to explain the combining section 60 associated with a case where the oscillator 70 is configured by using an LC resonator circuit.

FIG. 8 is used to explain the combining section 60 associated with a case where the oscillator 70 is configured by using an LC resonator circuit. According to the present embodiment, the combining section 60 includes therein a wire 42. The compulsory synchronization signal output from the differentiating circuit 40 is input into the load 50 via the wire 42 as shown in FIG. 8. Here, the wire 42 of the combining section 60 is positioned in the vicinity of the wire of the induction component 84. This makes it possible to couple the wire 42 and the induction component 84 by means of wire coupling capacitance and mutual inductance. The wire coupling capacitance and mutual inductance enable the compulsory synchronization signal to be injected into the oscillation signal. Such a configuration enables the combining section 60 to inject the compulsory synchronization signal into the oscillation signal without causing a significant influence on the load balance of the oscillator 70.

The combining section 60 may additionally include means to AC couple the wire 42 and induction component 84 directly. For example, the combining section 60 may include a capacitor between the wire 42 and induction component 84.

The foregoing description is made under the assumption that the oscillator 70 is configured by a ring oscillator circuit or an LC resonator circuit. However, the compulsory synchronization signal can be similarly injected into the oscillation signal which is generated by the oscillator 70 with a different configuration. Take an example where the oscillator 70 is configured as a differential ring oscillator circuit in which a differential element is used to configure a ring oscillator. In this case, the compulsory synchronization signal is injected into the positive logic input of the differential element, which can reduce the phase jitter component of the oscillation signal.

Figure 9:
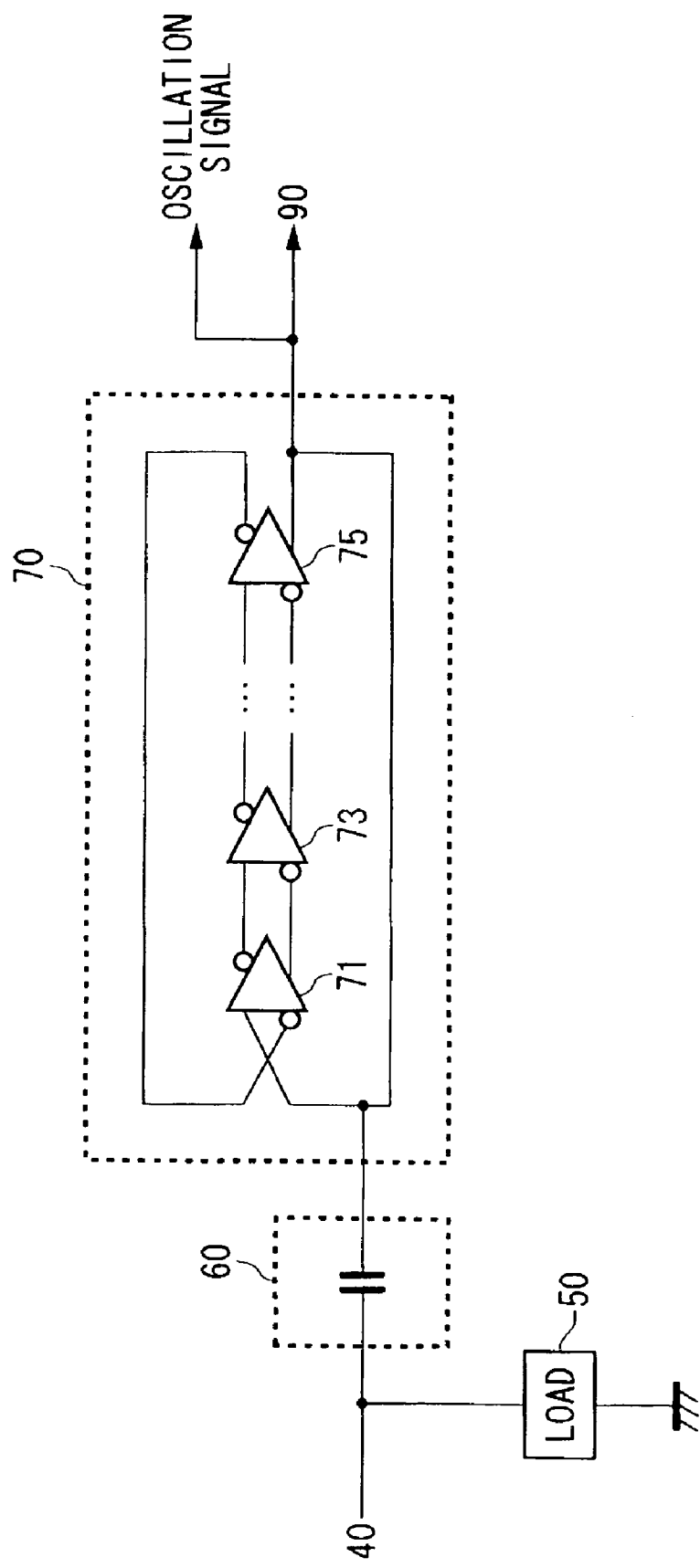
FIG. 9 shows another example of the configuration of the oscillator 70.

FIG. 9 shows another example of the configuration of the oscillator 70. The oscillator 70 relating to the present embodiment is a differential ring oscillator circuit including therein a plurality of cascaded differential amplifiers 71, 73 and 75. The inverted output of the differential amplifier 75 of the last stage among the plurality of differential amplifiers is fed back into the inverted input of the differential amplifier 71 of the first stage. The not-inverted output of the differential amplifier 75 of the last stage is fed back into the not-inverted input of the differential amplifier 71 of the first stage. This configuration enables the differential amplifier 75 of the last stage to output the oscillation signal.

According to the present embodiment, the combining section 60 capacitively couples the output terminal of the differential circuit 40 and the positive feedback path of the oscillator 70. In detail, similarly to the example illustrated with reference to FIG. 3, since the wire of the combining section 60 through which the compulsory synchronization signal passes is positioned in the vicinity of the positive feedback path of the oscillator 70, the combining section 60 combines the wire and the positive feedback path by using wire coupling capacitance. This configuration enables the compulsory synchronization signal to be injected into the oscillation signal generated by the oscillator 70 configured using the differential ring oscillator circuit.

Figure 10:
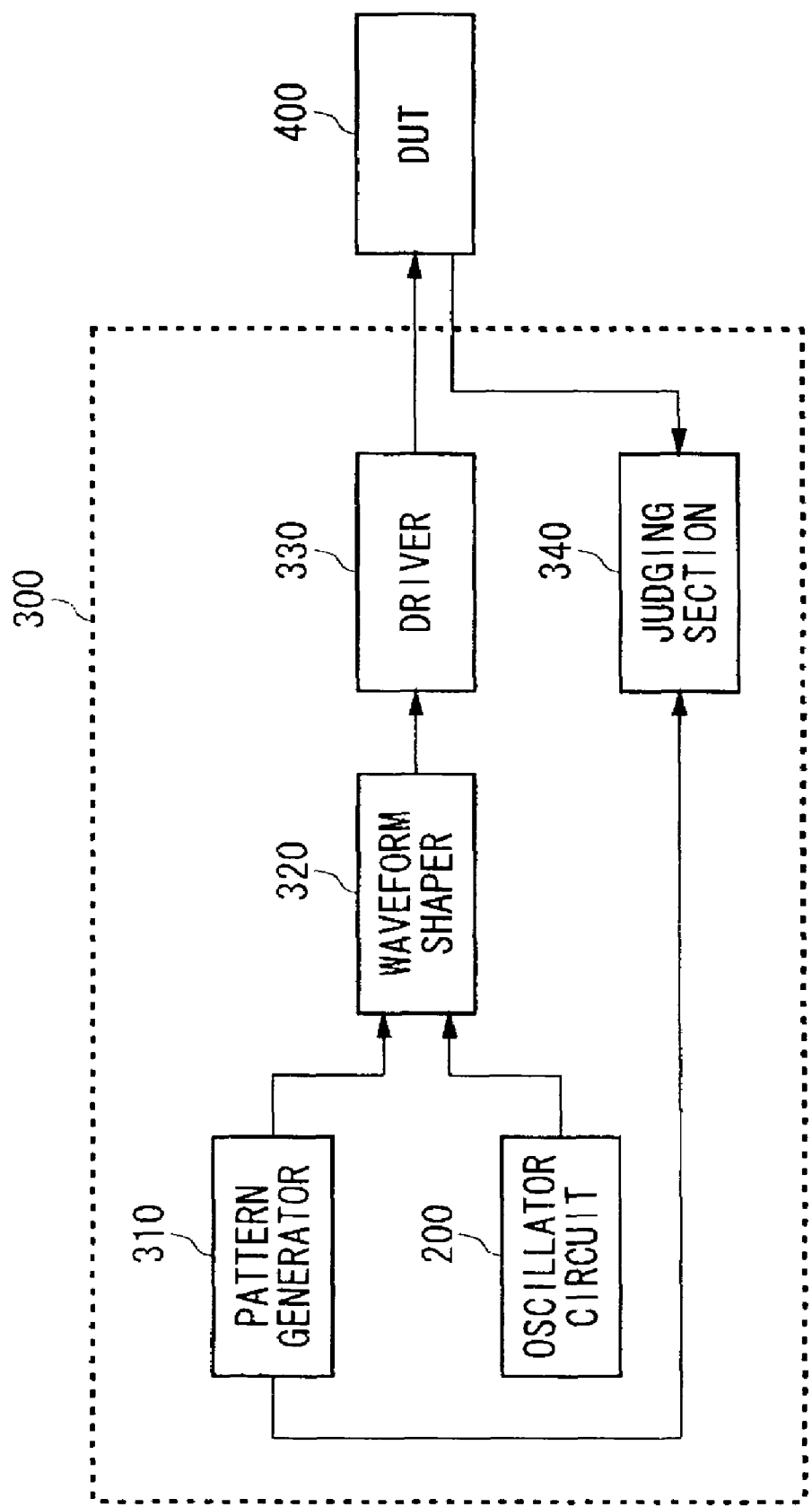
FIG. 10 shows an example of the configuration of a test apparatus 300 relating to another embodiment of the present invention.

FIG. 10 shows an example of the configuration of a test apparatus 300 relating to another embodiment of the present invention. The test apparatus 300 is used to test an electronic device 400 such as a semiconductor circuit. The test apparatus 300 includes therein a pattern generator 310, an oscillator circuit 200, a waveform shaper 320, a driver 330, and a judging section 340.

The pattern generator 310 generates a test pattern, which is digital data, for testing the electronic device 400. The oscillator circuit 200 generates an oscillation signal having a frequency determined in accordance with the frequency of the test signal to be input into the electronic device 400. The oscillator circuit 200 has the same configuration and functions as the oscillator circuit illustrated with reference to FIG. 4.

The waveform shaper 320 generates a test signal to be input into the electronic device 400 based on the test pattern generated by the pattern generator 310 and the oscillation signal. For example, the waveform shaper 320 generates a test signal whose value varies in accordance with the test pattern at the frequency of the oscillation signal. The driver 330 supplies the test signal generated by the waveform shaper 320 to the electronic device 400.

The judging section 340 judges whether the electronic device 400 is good or bad by comparing the output signal output from the electronic device 400 with an expected value pattern generated by the pattern generator 310. The test apparatus 300 relating to the present embodiment generates the test signal based on the oscillation signal having low phase jitter, and thus can accurately judge whether the electronic device 400 is good or bad. Here, the test apparatus 300 may include the oscillator circuit 100 illustrated with reference to FIG. 1, in place of the oscillator circuit 200.

The oscillator circuits 100 and 200 may be effectively utilized in various different manners. For example, the oscillator circuits 100 and 200 can be used for generating a clock in the field of wireless communications such as mobile telephones, generating a clock in the field of data communication, generating a clock in a microprocessor, and the like. In every case, the phase noise of the clock significantly affects the performance of the system, which indicates the oscillator circuits 100 and 200 can be effectively utilized.

According to some embodiments of the present invention, with a simple configuration, the continuity of the oscillation signal can be maintained, and the phase jitter component of the oscillation signal can be prevented from being accumulated so that an oscillation signal with a low phase noise is generated.

While one aspect of the present invention has been described through the embodiments, the technical scope of the invention is not limited to the above described embodiments. It is apparent to persons skilled in the art that various alternations and improvements can be added to the above-described embodiments. It is also apparent from the scope of the claims that the embodiments added with such alternations or improvements can be included in the technical scope of the invention.

What is claimed is:

1. An oscillator circuit that generates an oscillation signal, the oscillator circuit comprising:
   an oscillator that generates the oscillation signal based on positive feedback of a signal;
   a synchronization signal generating section that generates a compulsory synchronization signal having an edge that (i) crosses a zero cross point at an ideal timing of an edge of the oscillation signal every predetermined number of cycles of the oscillation signal and (ii) has a gradient in the same direction as the edge of the oscillation signal; and
   a combining section that injects the compulsory synchronization signal into a positive feedback path of the oscillator.

2. The oscillator circuit as set forth in claim 1, wherein the oscillator is a voltage controlled oscillator that generates the oscillation signal having a frequency determined in accordance with a control voltage supplied thereto,
   the oscillator circuit further comprises:
   a reference signal generating section that generates a reference signal which has a predetermined frequency, the reference signal controlling a phase of the oscillation signal; and
   a phase comparator that generates the control voltage based on a difference in phase between the reference signal and the oscillation signal and supplies the generated control voltage to the voltage controlled oscillator, and the synchronization signal generating section generates the compulsory synchronization signal based on the reference signal.

3. The oscillator circuit as set forth in claim 2, wherein the synchronization signal generating section inverts a signal generated by differentiating the reference signal and further differentiates the inverted signal, so as to generate the compulsory synchronization signal.

4. The oscillator circuit as set forth in claim 2, wherein the combining section and phase comparator alternately control the phase of the oscillation signal by means of the compulsory synchronization signal and control the frequency of the oscillation signal by means of the control voltage.

5. The oscillator circuit as set forth in claim 4, further comprising
a frequency dividing circuit that generates a frequency divided reference signal by dividing the frequency of the reference signal, wherein
the synchronization signal generating section generates the compulsory synchronization signal based on one of leading and trailing edges of the frequency divided reference signal, and
the phase comparator generates the control voltage based on a difference in phase between the other edge of the frequency divided reference signal and the oscillation signal.

6. The oscillator circuit as set forth in claim 5, wherein the synchronization signal generating section includes:
a leading edge differentiating circuit that differentiates the leading edge of the frequency divided reference signal;
an inverting circuit that inverts a signal output from the leading edge differentiating circuit; and
a differentiating circuit that differentiates a signal output from the inverting circuit.

7. The oscillator circuit as set forth in claim 6, wherein the oscillator is a ring oscillator circuit in which an odd number of stages of inverters are connected to each other in series in such a manner that the oscillation signal output from an inverter of the last stage is fed back into an input terminal of an inverter of the first stage, and the combining section capacitively couples an output terminal of the differentiating circuit and the input terminal of the inverter of the first stage so as to inject the compulsory synchronization signal.

8. The oscillator circuit as set forth in claim 6, wherein the oscillator is an LC resonator circuit including therein an induction component and a capacitance component, and
the combining section capacitively couples an output terminal of the differentiating circuit and the induction component so as to inject the compulsory synchronization signal.

9. A test apparatus that tests an electronic device, the test apparatus comprising:
a pattern generator that generates a test pattern to test the electronic device;
an oscillator circuit that generates an oscillation signal having a frequency determined in accordance with a frequency of a test signal to be input into the electronic device;
a waveform shaper that generates the test signal to be input into the electronic device based on the test pattern generated by the pattern generator and the oscillation signal generated by the oscillator circuit; and
a judging section that judges whether the electronic device is good or bad by comparing an output signal output from the electronic device with an expected value pattern generated by the pattern generator, wherein
the oscillator circuit includes:
an oscillator that generates the oscillation signal based on positive feedback of a signal;
a synchronization signal generating section that generates a compulsory synchronization signal having an edge that (i) crosses a zero cross point at an ideal timing of an edge of the oscillation signal every predetermined number of cycles of the oscillation signal and (ii) has a gradient in the same direction as the edge of the oscillation signal; and
a combining section that injects the compulsory synchronization signal into a positive feedback path of the oscillator.

* * * * *